(12) United States Patent
Lapôtre et al.

(10) Patent No.: US 11,867,731 B2
(45) Date of Patent: Jan. 9, 2024

(54) METHOD AND DEVICE FOR PREDICTING MALFUNCTIONS OF A DUAL-CIRCUIT SOLENOID VALVE

(71) Applicant: SAFRAN ELECTRONICS & DEFENSE, Paris (FR)

(72) Inventors: Blaise Lapôtre, Moissy-Cramayel (FR); Loïc Parisot, Moissy-Cramayel (FR)

(73) Assignee: SAFRAN ELECTRONICS & DEFENSE, Paris (FR)

( * ) Notice: Subject to any disclaimer, the term of this patent is extended or adjusted under 35 U.S.C. 154(b) by 0 days.

(21) Appl. No.: 17/865,895

(22) Filed: Jul. 15, 2022

(65) Prior Publication Data

US 2023/0029067 A1 Jan. 26, 2023

(30) Foreign Application Priority Data

Jul. 16, 2021 (FR) ...................................... 2107700

(51) Int. Cl.
| | |
|---|---|
| *G01R 19/10* | (2006.01) |
| *F16K 31/06* | (2006.01) |
| *F16K 37/00* | (2006.01) |
| *G01R 31/00* | (2006.01) |
| *B64F 5/40* | (2017.01) |
| *B64D 41/00* | (2006.01) |

(52) U.S. Cl.
CPC .......... *G01R 19/10* (2013.01); *F16K 31/0679* (2013.01); *F16K 37/0041* (2013.01); *G01R 31/008* (2013.01); *B64D 41/00* (2013.01); *B64F 5/40* (2017.01)

(58) Field of Classification Search
CPC ... G01R 19/10; G01R 31/008; F16K 31/0679; F16K 37/0041; B64D 41/00; B64F 5/40; H01F 7/1607; H01F 2007/1684; H01F 2007/1692; H01F 7/1844
USPC ......................................................... 324/537
See application file for complete search history.

(56) References Cited

U.S. PATENT DOCUMENTS

| | | | | |
|---|---|---|---|---|
| 2015/0333498 | A1* | 11/2015 | Weeks | .................... H01H 83/04 324/509 |
| 2020/0284758 | A1* | 9/2020 | Suzuma | ................ G01N 33/204 |

FOREIGN PATENT DOCUMENTS

| | | |
|---|---|---|
| EP | 0369918 B1 | 1/1994 |
| EP | 0798502 B1 | 8/2001 |
| GB | 2323411 A | 9/1998 |

OTHER PUBLICATIONS

Rapport De Recherche Préliminaire / Opinion Écrite Sur La Brevetabilité De L'Invention dated Apr. 8, 2022, issued in corresponding French Application No. 2107700, filed Jul. 16, 2021, 5 pages.

* cited by examiner

*Primary Examiner* — Farhana A Hoque
(74) *Attorney, Agent, or Firm* — Christensen O'Connor Johnson Kindness PLLC

(57) ABSTRACT

A method for measuring the hardware and operational state of a dual-circuit solenoid valve including first and second coaxial coils each associated with a circuit is disclosed. The method includes the steps of injecting a sinusoidal current into the first coil; measuring the voltage induced across the terminals of the second coil; and plotting at least one curve of a first magnitude proportional to the measured induced voltage as a function of a second magnitude proportional to the injected sinusoidal current.

10 Claims, 2 Drawing Sheets

[Fig 1]
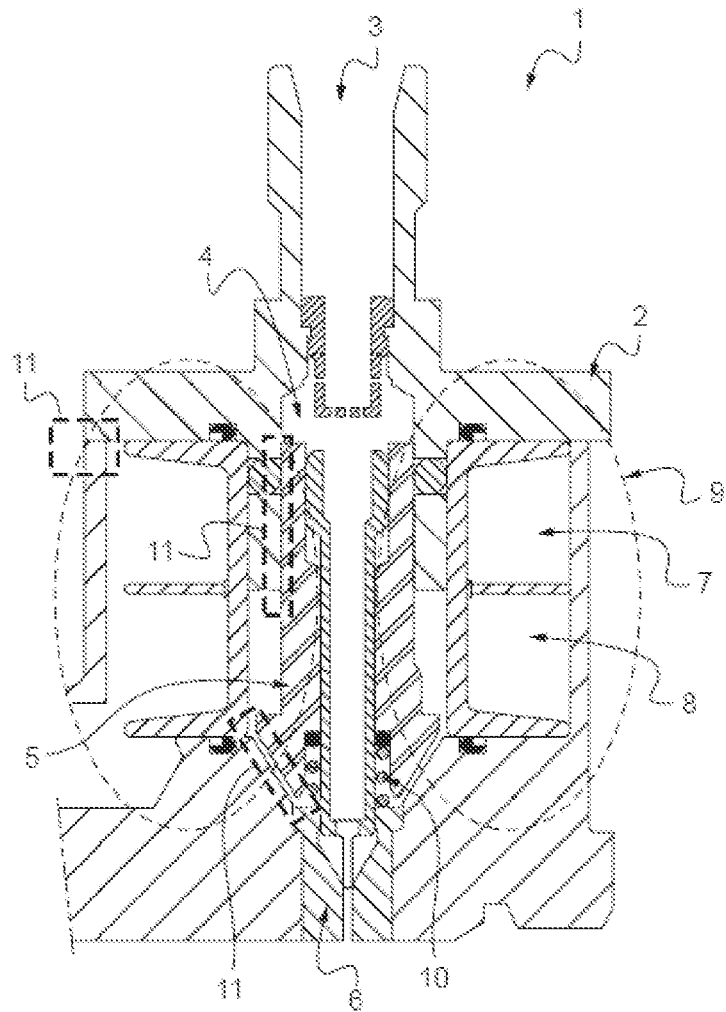
[Fig 2]

[Fig 3]
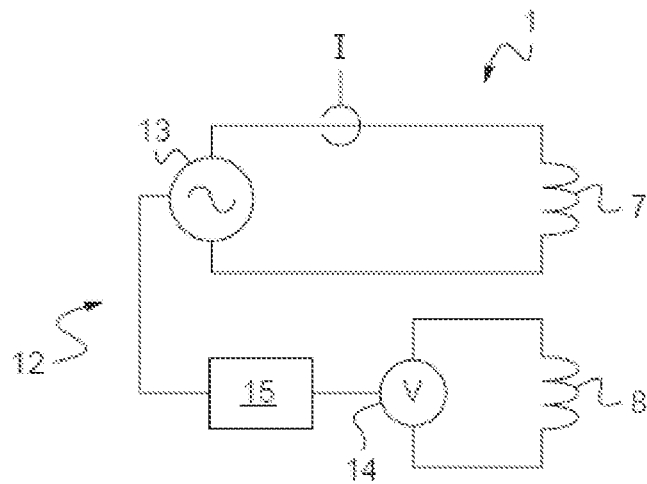
[Fig 4]
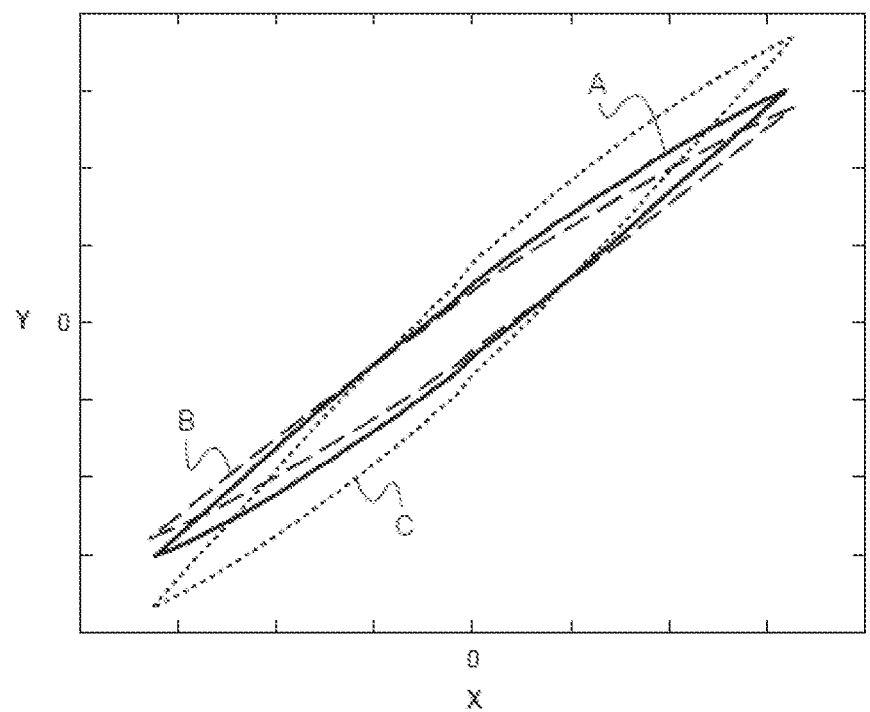

METHOD AND DEVICE FOR PREDICTING MALFUNCTIONS OF A DUAL-CIRCUIT SOLENOID VALVE

TECHNICAL FIELD

Embodiments of the present disclosure relate to dual-circuit solenoid valves, more particularly to a method for predicting malfunctions of a dual-circuit solenoid valve used in an emergency generator of an aircraft.

BACKGROUND

Some aircraft comprise two on-board electrical circuits powering the different electronic components of the aircraft. When one of the two on-board electrical circuits is defective or no longer works, the second circuit allows the aircraft to remain electrically-powered. However, in the event that both on-board circuits are out of service, some aircraft comprise an emergency hydraulic generator. This emergency hydraulic generator is activated or deactivated respectively via opening or closing a dual-circuit solenoid valve.

FIG. 1 shows a schematic section of a dual-circuit solenoid valve 1 according to the state of the art. The dual-circuit solenoid valve 1 comprises a cylindrical body 2 comprising internally an axial tubular passage 3 in which a hydraulic fluid flows.

The body 2 also comprises a central cavity 4 of a diameter which is larger than the passage 3, and a needle 5 which is movable longitudinally in the cavity 4. The dual-circuit solenoid valve 1 also comprises a nozzle 6. In a particular position of the needle 5, the nozzle 6 is obstructed by the needle 5, while in another particular position of the needle 5, the nozzle 6 is open and thus allows opening the dual-circuit solenoid valve 1.

The dual-circuit solenoid valve 1 further comprises a first coil 7 and a second coil 8, the first and second coils 7 and 8 being coaxial and each associated and nominally powered with a voltage, for example 28 volts, by one of the two on-board electrical circuits (not shown) for powering the aircraft. The two coils 7 and 8 are wound in the body 2 around the central cavity 4.

The passage of an electric current in one of the two coils 7 and/or 8 allows creating a magnetic field 9. Beyond an intensity of electric current in the coils which is greater than a threshold value, for example between 50 milliamperes and 150 milliamperes, the magnetic field is sufficient to move the needle 5 which then blocks the nozzle 6 and the dual-circuit solenoid valve 1 is closed. For example, the needle 5 is made of a ferromagnetic material.

Thus, when at least one of the two on-board electrical circuits is operational, it sends a current which is greater than the threshold value in the coils 7 and/or 8, which allows keeping the dual-circuit solenoid valve 1 closed. Conversely, when the two on-board electronic circuits are out of service, no current passes through the coils 7 and 8, and the dual-circuit solenoid valve 1 is opened under the action of a spring 10, thus allowing starting the hydraulic generator of the aircraft. The generator is used as an emergency power supply, in particular for the flight stability calculator.

The dual-circuit solenoid valve 1 also comprises air gaps 11 present along the path of the magnetic field at the body 2 and between the needle 5 and the body 2, the air gaps 11 can be of variable size according to the position of the needle 5 in the central cavity 4.

No performance diagnosis currently exists for this type of dual-circuit solenoid valve 1. It is advisable to wait for the failure to replace it. There is therefore no possibility of anticipating the failure by detecting faults in the dual-circuit solenoid valve 1.

Currently, checking the operation of the dual-circuit solenoid valve 1 is performed when the aircraft is started. To do this, the two on-board electrical circuits are cut and it is checked that the emergency generator starts to operate.

SUMMARY

The aim of the present disclosure is therefore to overcome the aforementioned drawback, or others, by allowing predicting failures and highlighting performance drifts.

Embodiments of the present disclosure relate to a method for measuring the hardware and operational state of a dual-circuit solenoid valve comprising first and second coaxial coils each associated with a power supply circuit. In an embodiment, the method comprises the following steps:

injecting a sinusoidal current into the first coil;

measuring the voltage induced across the terminals of the second coil; and plotting at least one curve of a first magnitude proportional to the measured induced voltage as a function of a second magnitude proportional to the injected sinusoidal current.

This method, for example, allows quickly measuring the magnetic performance of a dual-circuit solenoid valve, without disassembly and without passage of the solenoid valve on a test bench. Rather, this method, for example, requires only a generator and a voltmeter. In addition, the measured performance can be correlated to mechanical performance and indicate faults in the solenoid valve in order to predict failures that would have been detected only later.

In some embodiments, the method may further comprise one or both of the following steps:

comparing the at least one curve with at least one reference curve of the dual-circuit solenoid valve;

identifying faults in the dual-circuit solenoid valve from the comparison step.

Advantageously, the method is implemented when the solenoid valve is open or closed.

Advantageously, the injected current is sinusoidal around a value of 0 milliampere when the solenoid valve is open, and in which the injected current is sinusoidal around a value which is greater than the intensity required for the dual-circuit solenoid valve to be closed.

Advantageously, the amplitude of the sinusoidal current is comprised between 50 milliamperes and 200 milliamperes.

In one embodiment, the identification step is performed by learning and/or recognition algorithms.

Embodiments of the method may be implemented for a dual-circuit solenoid valve of an emergency hydraulic generator of an aircraft.

Embodiments of the method may be further implemented during the manufacture of the dual-circuit solenoid valve or when the aircraft is under maintenance on the ground, or during the flight of the aircraft.

The disclosure also relates to a device for measuring the hardware and operational state of a dual-circuit solenoid valve comprising first and second coaxial coils each associated with a circuit for powering the coils. In an embodiment, the device comprises a sinusoidal current generator configured to inject a sinusoidal current into the first coil, means for measuring the voltage induced across the terminals of the second coil depending on the intensity of the injected current and means for comparing the measured voltage with reference curves.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 1 which has already been mentioned, schematically illustrates a section of a dual-circuit solenoid valve according to the state of the art;

FIG. 2 illustrates the different steps of a method for measuring the hardware and operational state of a dual-circuit solenoid valve according to the disclosure;

FIG. 3 schematically illustrates a schematic view of a device for measuring the hardware and operational state of a dual-circuit solenoid valve; and FIG. 4 is a graph representing three examples of curves of a first magnitude proportional to the measured induced voltage as a function of a second magnitude proportional to the injected sinusoidal current.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

The different steps of a representative method for measuring the hardware and operational state of a dual-circuit solenoid valve 1 are shown in FIG. 2. The method illustrated in FIG. 2 may be implemented using a dual-circuit solenoid valve, such as for example, the dual-circuit solenoid valve 1 previously described using FIG. 1. The description of the method will therefore also be made with reference to a solenoid valve according to FIG. 1.

The method allows, for example, checking the proper operation of the dual-circuit solenoid valve 1 and predicting its failure without having to disassemble it. This method may be, for example, carried out during the maintenance phase when the aircraft is on the ground, or else after the manufacture of the dual-circuit solenoid valve to check its conformity at the end of production, or even during the flight of the aircraft.

In some embodiments, the method can be implemented to check the proper operation of the dual-circuit solenoid valve 1 when the latter is open, or else when the latter is closed.

In a first step 21, a sinusoidal current is injected into the first coil 7.

In an embodiment, the purpose of the method is to check the proper operation of the dual-circuit solenoid valve 1 when the latter is open. The injected current is then sinusoidal around a value of, for example, zero milliamperes. No bias (also called "offset") is necessary to open the dual-circuit solenoid valve 1 since the latter is naturally open when no current is applied to the coils 7 and/or 8.

In another embodiment, the purpose of the method is to check the proper operation of the dual-circuit solenoid valve when the latter is closed. The injected current is then sinusoidal around a threshold value which is greater than the intensity necessary for the dual-circuit solenoid valve 1 to be closed. Such a threshold value is for example comprised between, for example, about 100 and about 250 milliamperes. The bias applied to the injected current is therefore equivalent.

In some embodiments, the amplitude of the injected sinusoidal current is, for example, comprised between 50 milliamperes and 200 milliamperes.

The first coil 7 and the second coil 8 are positioned close to each other and coaxial. As a result, the injection of a sinusoidal current into the first coil 7 induces a voltage across the terminals of the second coil 8.

In a second step 22, the voltage induced across the terminals of the second coil 8 is measured. The coils 7 and 8 can also be inverted for current injection and voltage measurement.

The first and second steps 21 and 22 are performed simultaneously using a current generator and a means for measuring the voltage induced across the terminals of the second coil, such as a voltmeter or equivalents thereof.

FIG. 3 shows a schematic view of a representative device 12 for measuring the hardware and operational state of a dual-circuit solenoid valve 1 comprising first and second coaxial coils 7 and 8. In some embodiments, the device comprises a sinusoidal current generator 13 for injecting a sinusoidal current I into the first coil 7 and means 14 for measuring the induced voltage V across the terminals of the second coil 8 depending on the intensity of the injected current I, for example a voltmeter.

According to the accessibility of the dual-circuit solenoid valve 1, the current generator 13 and the voltmeter 14 can be, for example, installed directly on the connectors of the coils 7 and 8 of the dual-circuit solenoid valve 1, or on a wire harness going up to the aircraft control system, itself accessible from the electronics bay of the aircraft.

In a third step 23, the curve of the measured induced voltage is plotted as a function of the intensity of the injected sinusoidal current. Alternatively, and according to the magnitudes considered useful by the maintenance technician, a first magnitude proportional to the measured induced voltage can be plotted as a function of a second magnitude proportional to the injected sinusoidal current. Any suitable configured (e.g., programmed) circuitry and/or display may be employed to carry out step 23.

In a fourth step 24, the obtained curve is compared with a reference curve of the dual-circuit solenoid valve 1. The reference curve is, for example, a curve obtained for performance of the dual-circuit solenoid valve 1 as desired. For example, the comparison is performed with a reference curve for a dual-circuit solenoid valve 1 closed or with a reference curve for an open dual-circuit solenoid valve. The device 12 therefore further comprises means 15 for comparing the measured voltage with reference curves. Means 15 may be, for example, any suitable configured (e.g., programmed) circuitry, display, or equivalents thereof for carrying out step 24.

FIG. 4 shows examples of curves of a first magnitude Y proportional to the measured induced voltage as a function of a second magnitude X proportional to the injected sinusoidal current.

The obtained curves allow, for example, the characterization of the mechanical and magnetic properties of the dual-circuit solenoid valve 1. This characterization allows ensuring the proper condition of a certain number of parts of the dual-circuit solenoid valve 1, for example the body 2, the needle 5, the coils 7 and/or 8, the spring 10 or even the size of the air gaps 11.

Thus, in a fifth step 25, faults of the dual-circuit solenoid valve 1 are identified from the comparison of the curves. In some embodiments, such faults can be identified visually of a display, or may be determined by suitably configured (e.g., programmed) circuitry, etc.

By way of example, FIG. 4 illustrates the curves obtained for different longitudinal positions of the needle 5 in the central cavity 4 when the dual-circuit solenoid valve 1 is open. The first curve A is a reference curve A for a needle 5 which is positioned such that the dual-circuit solenoid valve is open and delivers performance as desired, for example a fluid flow as desired. The second curve B is a curve B obtained for a needle B which is positioned such that the dual-circuit solenoid valve 1 is too open and delivers a higher fluid flow than that desired. Conversely, the third curve C illustrates a curve C obtained for a needle 5 which is positioned such that the dual-circuit solenoid valve 1 is not open enough and delivers a lower flow than that desired.

The study and comparison of the overall shape of the hysteresis cycles of the curves A, B and C allows deducing the faults of the dual-circuit solenoid valve 1.

The collection of data concerning, for example, all possible faults of the dual-circuit solenoid valves allows for facilitation of the step 25 of identifying the faults of the dual-circuit solenoid valve. In some embodiments, this identification step 25 is, for example, performed by learning and/or recognition algorithms in the means 15 for comparing the measured voltage with reference curves. In some embodiments, learning and/or recognition algorithms are trained, carried out, etc, by a neutral network. In some of these embodiments, the neural network may be, for example, a convolutional neural network.

In some embodiments, the identification step 25 allows for one or more of the following:
highlighting position or travel problems of the needle 5, in the open, closed or intermediate position;
detecting positioning faults of the parts, in particular relative to the size of the air gaps 11;
detecting changes in the properties of the material, following for example mechanical or thermal shocks.

Indeed, these faults create variations in the magnetic field passing through the elements of the dual-circuit solenoid valve, which creates variations in the plotted curves relative to the reference curves.

Certain embodiments disclosed herein, or components thereof, such as for example means 15, may utilize circuitry (e.g., one or more circuits) in order to implement standards, protocols, methodologies or technologies disclosed herein, operably couple two or more components, generate information, process information, generate and plot information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of hardware circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors, such as, for example, microprocessors, or portions thereof and accompanying software, firmware, hardware, and the like.

In some examples, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality described herein.

Of course, in some embodiments, two or more of these components, or parts thereof, can be integrated or share hardware and/or software, circuitry, etc. In some embodiments, these components, or parts thereof, may be grouped in a single location or distributed over a wide area. In circumstances where the components are distributed, the components are accessible to each other via communication links.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also, in this regard, the present application may use the term "plurality" to reference a quantity or number. In this regard, the term "plurality" is meant to be any number that is more than one, for example, two, three, four, five, etc. The term "about," "approximately," etc., means plus or minus 5% of the stated value.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for measuring the hardware and operational state of a dual-circuit solenoid valve comprising first and second coaxial coils each associated with a power supply circuit, comprising:
    injecting a sinusoidal current into the first coil;
    measuring the voltage induced across the terminals of the second coil; and
    plotting at least one curve of a first magnitude proportional to the measured induced voltage as a function of a second magnitude proportional to the injected sinusoidal current.

2. The method according to claim 1, further comprising:
    comparing the at least one curve with at least one reference curve of the dual-circuit solenoid valve; and
    identifying faults in the dual-circuit solenoid valve based on said comparing.

3. The method according to one of claim 1, wherein the method is implemented when the dual-circuit solenoid valve is open or closed.

4. The method according to claim 3, wherein the injected current is sinusoidal around a value of 0 milliampere when the dual-circuit solenoid valve is open, and wherein the injected current is sinusoidal around a value which is greater than the intensity required for the dual-circuit solenoid valve to be closed.

5. The method according to claim 1, wherein the amplitude of the sinusoidal current is between 50 milliamperes and 200 milliamperes.

6. The method according to claim 2, wherein said identifying faults in the dual-circuit solenoid valve is performed by one or more circuits configured to run learning and/or recognition algorithms.

7. The method according to claim 1, implemented for a dual-circuit solenoid valve of an emergency hydraulic generator of an aircraft.

8. The method according to claim 1, implemented during the manufacture of the dual-circuit solenoid valve or when the aircraft is under maintenance on the ground, or during the flight of the aircraft.

9. A device for measuring the hardware and operational state of a dual-circuit solenoid valve having first and second coaxial coils each associated with a circuit for powering the coils, the device comprising:
    a sinusoidal current generator configured to inject a sinusoidal current into the first coil;
    means for measuring the voltage induced across the terminals of the second coil depending on the intensity of the injected current; and
    means for comparing the measured voltage with reference curves.

10. A device for measuring the hardware and operational state of a dual-circuit solenoid valve having first and second coaxial coils each associated with a circuit for powering the coils, the device comprising:
    a sinusoidal current generator configured to inject a sinusoidal current into the first coil;
    a voltmeter configured to measure the voltage induced across the terminals of the second coil depending on the intensity of the injected current; and
    one or more circuits configured to compare the measured voltage with one or more reference curves.

* * * * *